United States Patent
Barkhordarian

(10) Patent No.: US 6,838,710 B1
(45) Date of Patent: Jan. 4, 2005

(54) COMPOUND SEMICONDUCTOR PROTECTION DEVICE FOR LOW VOLTAGE AND HIGH SPEED DATA LINES

(75) Inventor: Vrej Barkhordarian, Glendale, CA (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 10/744,160

(22) Filed: Dec. 22, 2003

Related U.S. Application Data

(63) Continuation of application No. 10/096,995, filed on Mar. 12, 2002, now Pat. No. 6,683,334.

(51) Int. Cl.[7] .......................................... H01L 21/072
(52) U.S. Cl. ...................... 257/199; 257/199; 257/198
(58) Field of Search .................... 257/199, 362, 257/355, 97, 197, 112, 168; 361/56, 212

(56) References Cited

U.S. PATENT DOCUMENTS

| | | | |
|---|---|---|---|
| 4,631,562 A | | 12/1986 | Avery |
| 4,736,271 A | * | 4/1988 | Mack et al. ................ 361/56 |
| 5,166,083 A | | 11/1992 | Bayraktaroglu |
| 5,528,189 A | | 6/1996 | Khatibzadeh |
| 5,631,493 A | | 5/1997 | Pezzani |
| 5,744,842 A | * | 4/1998 | Ker ........................ 257/362 |
| 5,859,447 A | | 1/1999 | Yang et al. |
| 6,060,752 A | * | 5/2000 | Williams .................. 257/355 |
| 6,075,276 A | | 6/2000 | Kitamura |
| 6,151,202 A | * | 11/2000 | Mueller et al. ............ 361/212 |
| 6,191,466 B1 | | 2/2001 | Yamashita et al. |
| 6,396,107 B1 | | 5/2002 | Brennan et al. |
| 6,430,016 B1 | | 8/2002 | Marr |
| 6,448,599 B1 | | 9/2002 | Wang |
| 6,456,472 B1 | * | 9/2002 | Beriault ..................... 361/56 |
| 6,498,050 B2 | | 12/2002 | Fujimoto |
| 6,683,334 B2 | * | 1/2004 | Barkhordarian ............ 257/199 |
| 2003/0168701 A1 | * | 9/2003 | Voldman .................... 257/355 |

\* cited by examiner

*Primary Examiner*—David Nelms
*Assistant Examiner*—Thinh T Nguyen
(74) *Attorney, Agent, or Firm*—Knobbe, Martens, Olson & Bear, LLP.

(57) ABSTRACT

The invention relates to the protection of devices in a monolithic chip fabricated from an epitaxial wafer, such as a wafer for a Group III–V compound semiconductor or a wafer for a Group IV compound semiconductor. Devices fabricated from Group III–V compound semiconductors offer higher speed and better isolation than comparable devices from silicon semiconductors. Semiconductor devices can be permanently damaged when exposed to an undesired voltage transient such as electrostatic discharge (ESD). However, conventional techniques developed for silicon devices are not compatible with processing techniques for Group III–V compound semiconductors, such as gallium arsenide (GaAs). Embodiments of the invention advantageously include transient voltage protection circuits that are relatively efficiently and reliably manufactured to protect sensitive devices from undesired voltage transients. A protection circuit can be monolithically integrated with the protected circuit or can be packaged in a separate integrated circuit.

10 Claims, 5 Drawing Sheets

COMPOUND SEMICONDUCTOR PROTECTION DEVICE FOR LOW VOLTAGE AND HIGH SPEED DATA LINES

RELATED APPLICATION

This application is a continuation application of U.S. application Ser. No. 10/096,995, entitled "COMPOUND SEMICONDUCTOR PROTECTION DEVICE FOR LOW VOLTAGE AND HIGH SPEED DATA LINES," filed Mar. 12, 2002 now U.S. Pat. No. 6,683,334 the entirety of which is incorporated herein by reference.

BACKGROUND OF THE INVENTION

1. Field of the Invention

The invention generally relates to compound semiconductors. In particular, the invention relates to the protection of circuits from undesired transient voltage spikes such as those from electrostatic discharge (ESD).

2. Description of the Related Art

An undesired voltage transient on a data line can damage an electronic circuit. As technology progresses and device geometries continue to shrink, devices become ever more sensitive to voltage transients. One example of a source of an undesired voltage transient is electrostatic discharge (ESD).

Steering diodes and transient voltage suppressors have been applied to data lines in conventional circuits implemented in silicon. Where such steering diodes and/or transient voltage suppressors are fabricated from silicon on a monolithic chip, pnpn or npnp thyristor latchup can occur, which can also damage the electronic circuit. Although incorporating discrete diodes and transient voltage suppressors on a monolithic chip is possible, such incorporation techniques can involve relatively expensive double-sided processing techniques and alignment methods, which are complex, expensive, and not standard tools in the processing of silicon. Silicon has other disadvantages, such as relatively low speed and relatively low isolation between devices. The relatively low isolation between devices gives rise to relatively high leakage currents and can rapidly drain the batteries of battery-powered circuits.

Faster devices, such as heterojunction bipolar transistors (HBTs) and monolithic microwave integrated circuits (MMICs), using Group III–V compound semiconductors such as gallium arsenide (GaAs), indium phosphide (InP), and the like, are preferred in certain relatively high-speed applications, such as in relatively high-speed digital circuits and in relatively high-frequency wireless circuits. Such circuits are also sensitive to undesired voltage transients. In conventional compound semiconductor circuits, a transient voltage protection circuit is fabricated from discrete components and coupled to a monolithic compound semiconductor circuit through bond wires and die attach. This results in a relatively low assembly yield and poor performance. For example, the bond wires can exhibit relatively significant inductance, which can decrease protection from relatively fast transients. In addition, relatively high parasitic capacitance from the wire-bonded discrete components renders such transient voltage protection circuits relatively ill suited to high-speed circuits such as microwave circuits.

What is needed is a transient voltage protection circuit that is monolithically integrated in a compound semiconductor circuit to protect the sensitive devices from undesired voltage transients.

SUMMARY OF THE INVENTION

The invention relates to the protection of devices in a monolithic chip fabricated from an epitaxial wafer, such as a wafer of a Group III–V compound semiconductor. A Group IV compound semiconductor can also be used. Devices fabricated from Group III–V compound semiconductors offer higher speed and better isolation than comparable devices from silicon semiconductors. Semiconductor devices can be permanently damaged when exposed to an undesired voltage transient such as electrostatic discharge (ESD). However, conventional techniques developed for silicon devices are not compatible with processing techniques for devices that are fabricated from epitaxial wafers, such as gallium arsenide (GaAs), which is a Group III–V compound semiconductor. Embodiments of the invention advantageously include transient voltage protection circuits that are relatively efficiently and reliably manufactured to protect sensitive devices from undesired voltage transients. Embodiments of the invention include circuits that are monolithically integrated with the circuit to be protected and also include circuits that are fabricated and packaged in a separate integrated circuit and are coupled via a printed wiring board (PWB) or printed circuit board (PCB) and placed in front of the circuit to be protected in the data path.

One embodiment according to the invention includes a protection circuit that protects devices coupled to a signal or data line from undesired transients on the signal line. The protection circuit is fabricated as a separate circuit and coupled to a circuit to be protected or can be monolithically integrated with the circuit to be protected. For example, the protection circuit can be part of a separate integrated circuit (IC) and attached to a PWB for coupling to the circuit to be protected. In one embodiment, the protection circuit is relatively near to an input/output (I/O) port, and the circuit to be protected is coupled to the I/O port through traces in the PWB that are coupled to the protection circuit. Advantageously, the protection circuit can be formed on the same side of a monolithic epitaxial substrate as the devices that are protected by the protection circuit. The monolithic epitaxial substrate can correspond to a Group III–V compound semiconductor or a Group IV compound semiconductor. For example, the Group III–V compound semiconductor can correspond to gallium arsenide (GaAs) substrates and indium phosphide (InP) substrates. Other examples of epitaxial wafers from which the protection circuit can be formed include indium gallium phosphide (InGaP), gallium nitride (GaN), aluminum gallium arsenide (AlGaAs), indium gallium arsenide (InGaAs), indium gallium aluminum phosphide (InGaAlP), indium gallium arsenide phosphide (InGaAsP), indium gallium nitride (InGaN), aluminum gallium nitride (AlGaN), and others currently in existence or later developed. Examples of Group IV compound semiconductors include silicon carbide (SiC) and silicon germanium (SiGe), which can be based on a semi-insulating SiC substrate.

The protection circuit includes a first steering diode collection and a second steering diode collection. Embodiments of the protection circuit can optionally include a breakdown diode. The first steering diode collection and the second steering diode collection can include a single diode or can include an arrangement of diodes connected in series. The arrangement of multiple diodes in a stack can increase the forward voltage drop of the arrangement and thereby can advantageously be used to protection circuit without a breakdown diode. However, a breakdown diode can also be included in the protection circuit. A diode in the first steering diode collection or the second steering diode collection is fabricated from a base-collector junction of a transistor configured as a diode. In one embodiment, the portion of the transistor configured as a diode that would correspond to an emitter is removed by, for example, an etching process.

An anode of the first steering diode collection is electrically coupled to the signal line, and a cathode of the first steering diode collection is electrically coupled to a first reference. The first reference can include power supply sources and ground. A cathode of the second steering diode collection is electrically coupled to the signal line, and an anode of the second steering diode collection is electrically coupled to a second reference. The second reference can include negative power supply sources and ground. In one embodiment, the first steering diode collection is electrically coupled to the second steering diode collection through a metallization layer.

One embodiment of the protection circuit further includes a breakdown diode or transient voltage suppression (TVS) diode formed from a base-emitter junction of a transistor configured as the breakdown diode. Advantageously, the TVS diode can provide protection from undesired transients on a corresponding power supply line, such as $V_{CC}$. The TVS diode A cathode of the breakdown diode is electrically coupled to the cathode of the first steering diode collection, and an anode of the breakdown diode is electrically coupled to the anode of the second steering diode collection. Advantageously, the breakdown diode is formed on the same side of the monolithic semi-insulating gallium arsenide (GaAs) substrate as the steering diodes and the devices to be protected.

In one embodiment, a plurality of first steering diode collections and a plurality of second steering diode collections, which are electrically coupled to and protect multiple signal lines, are electrically coupled to a single breakdown diode, thereby saving space and cost.

One embodiment according to the invention includes a method of producing a monolithic integrated chip with built-in transient voltage suppression. The method provides a substrate assembly made from an epitaxially-grown wafer, such as a Group III–V compound semiconductor, and includes a semi-insulating substrate, an N+ sub-collector layer, an N-type collector layer, a P-type base layer, and an N-type emitter layer. Selected portions of the N-type emitter layer are removed to isolate transistors and steering diodes. Optionally, selected portions of the N-type emitter layer are removed to isolate breakdown diodes. Remaining portions of the N-type emitter layer can be used to fabricate emitters for transistors. Where breakdown diodes are also fabricated, selected portions of the N-type emitter layer are also used as cathodes for breakdown diodes. Selected portions of the P-type base layer are also removed to isolate transistors and steering diodes. Optionally, selected portions of the P-type base layer are also removed to isolate breakdown diodes. Remaining portions of the P-type base layer can be used to fabricate bases for transistors and anodes for steering diodes. Where breakdown diodes are fabricated, selected portions of the P-type base layer are also used as anodes for breakdown diodes. Selected portions of the N-type collector layer are removed to isolate transistors and steering diodes. Remaining portions of the N-type collector layer can be used to fabricate collectors for transistors and cathodes for steering diodes. Where breakdown diodes are also fabricated, the process selectively removes portions of the N-type collector layer to isolate breakdown diodes.

Regions of the N+ sub-collector layer are isolated, by ion-implantation techniques and the like, to isolate transistors and steering diodes. An insulating layer is formed on the selected portions of the substrate assembly to provide electrical insulation and to prevent contamination of underlying layers. Electrical connections such as contacts and metallization are formed to electrically couple the transistors and the steering diodes as applicable. In one embodiment, the method further includes the removal of substantially all of the N-type emitter layer above a portion of a base layer that is used to form an anode of a steering diode.

One embodiment according to the invention includes a method of producing a monolithic integrated chip with built-in transient voltage suppression. The method provides a substrate assembly made from an epitaxially-grown wafer, such as a gallium arsenide (GaAs) Group III–V compound semiconductor, and includes a semi-insulating substrate, an N+ sub-collector layer, an N-type collector layer, a P-type base layer, and an N-type emitter layer.

The method forms a transistor by removing a first portion of the N-type emitter layer, a first portion of the P-type base layer, and a first portion of the N-type collector layer from around a second portion of the N-type emitter layer, by removing a second portion of the P-type base layer, and by removing a second portion of the N-type collector layer. A first portion or island of the N+ sub-collector layer is isolated by ion implantation, etching techniques, and the like.

The method forms a steering diode by removing a third portion of the N-type emitter layer including substantially all of a portion of the N-type emitter layer above a third portion and a fourth portion of the P-type base layer. The third portion of the P-type base layer and a third portion of the N-type collector layer are removed from around the fourth portion of the P-type base layer and a fourth portion of the N-type collector layer. The fourth portion of the P-type base layer and the fourth portion of the N-type collector layer are used as an anode and a cathode, respectively, of the steering diode. At least two steering diodes on the substrate assembly are electrically coupled to a transistor to protect the transistor on the substrate assembly from an undesired voltage transient.

In one embodiment, the method further forms a breakdown diode by using a base of the transistor as an anode of the breakdown diode and by using an emitter of the transistor as a cathode of the breakdown diode. In another embodiment, the method forms a breakdown diode by using a base of the transistor as an anode of the breakdown diode and by using a collector of the transistor as a cathode of the breakdown diode.

Another embodiment includes a method of producing a monolithic integrated chip with transient voltage suppression from a monolithic epitaxial semiconductor substrate with a semi-insulating substrate, a P+ sub-collector layer, a P-type collector layer, an N-type base layer, and a P-type emitter layer.

Another embodiment according to the invention includes a method of using pre-grown layers in a monolithic substrate assembly made from a Group III–V compound semiconductor such as gallium arsenide (GaAs) to form a transient voltage protection circuit. The method includes fabricating collector regions for transistors and cathode regions for steering diodes from an N-type collector layer. Base regions for transistors and anode regions for steering diodes are fabricated from a P-type base layer. Emitter regions for transistor and cathode regions for breakdown diodes are fabricated from an N-type emitter layer.

An anode of a first steering diode is electrically coupled to a data line that is also electrically coupled to a transistor.

A cathode of the first steering diode is electrically coupled to a first reference to protect the transistor from an undesired positive-going voltage transient. A cathode of a second steering diode is electrically coupled to the anode of the first steering diode and to the data line. An anode of the second steering diode is electrically coupled to a second reference to protect the transistor from an undesired negative-going voltage transient. One embodiment of the method further fabricates a cathode and an anode of a breakdown diode from the N-type emitter layer and the P-type base layer, respectively. The breakdown diode is electrically coupled to steering diodes to protect against voltage transients on reference lines such as power and ground.

One embodiment includes a method of protecting a device on a monolithic gallium arsenide (GaAs) chip from undesired voltage transients on a signal line. The method includes clamping the signal line to a first positive voltage when the chip is in a powered-on state in response to an undesired voltage transient with a positive-going spike, where the first positive voltage is a multiple of a forward voltage drop of a monolithically integrated diode above a power supply voltage that is supplied to the monolithic chip. The method further includes clamping the signal line to a second positive voltage when the monolithic chip is in a powered-off state, where the second positive voltage is a sum of the first multiple of the forward voltage drop of the monolithically integrated diode and a reverse breakdown voltage of a breakdown diode that is also integrated into the monolithic chip. The method further includes clamping the signal line to a negative voltage that is a multiple of a forward voltage drop of a monolithically integrated diode below a ground potential in response to an undesired voltage transient with a negative-going spike. In addition, one embodiment further includes protecting multiple signal lines through multiples steering diodes that are coupled to a common breakdown diode on the monolithic chip.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the invention is defined only by reference to the appended claims.

While illustrated in the context of gallium arsenide (GaAs), the skilled artisan will appreciate that the principles and advantages described herein are applicable to other types of epitaxial wafers, including epitaxial wafers fabricated from indium phosphide (InP) and the like.

Figure 1:
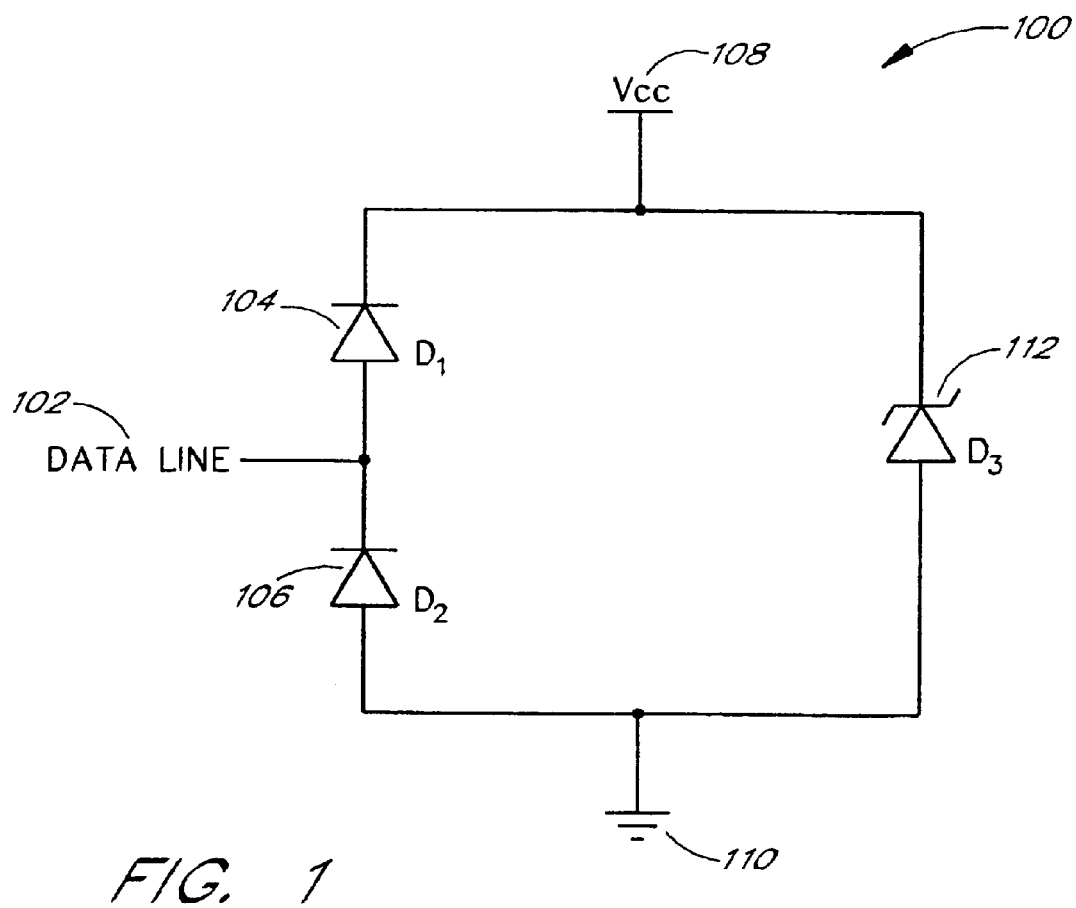
FIG. 1 illustrates a transient voltage protection circuit according to an embodiment the invention.

FIG. 1 illustrates a transient voltage protection circuit 100 according to an embodiment the invention. The transient voltage protection circuit 100 limits an undesired voltage transient on a data line 102 to a safe level to protect transistors and other devices that are electrically coupled to the data line 102.

The data line 102 is electrically coupled to an anode of a first steering diode 104, $D_1$, and to a cathode of a second steering diode 106, $D_2$. As will be described later in connection with FIGS. 4 and 5, the first steering diode 104, $D_1$, and the second steering diode 106, $D_2$, can be fabricated from epitaxial layers on a monolithic chip that are intended to be used to fabricate a base-collector junction of a compound semiconductor transistor.

The first steering diode 104, $D_1$, suppresses positive-going voltage transients on the data line 102. The second steering diode 106, $D_2$, suppresses negative-going voltage transients on the data line 102. In the embodiment illustrated in FIG. 1, the first steering diode 104, $D_1$, and the second steering diode 106, $D_2$, are drawn as single diodes. However, in other embodiments, the first steering diode 104, $D_1$, and the second steering diode 106, $D_2$, can include multiple diodes as will be described later in connection with FIG. 2. The stacking of multiple diodes can be advantageously used to select a forward voltage drop across the first steering diode 104, $D_1$, or the second steering diode 106, $D_2$. The selected voltage drop can be used to select the voltage threshold levels at which the transient voltage protection circuit 100 clamps the undesired voltage transients on the data line 102.

In the illustrated embodiment of the transient voltage protection circuit 100, a cathode of the first steering diode 104, $D_1$, is electrically coupled to a voltage supply 108, $V_{CC}$. The voltage supply 108, $V_{CC}$, can be the source of power to the protected circuit. However, it will be understood by one of ordinary skill in the art that other voltage references, including ground, can also be used. In another embodiment described later in connection with FIG. 3B, rather than electrically couple the cathode of the first steering diode 104, $D_1$, to the voltage supply 108, $V_{CC}$, the cathode of the first steering diode 104, $D_1$, is electrically coupled to ground, and the first steering diode 104, $D_1$, includes multiple diodes to increase the forward voltage drop of the first steering diode 104, $D_1$, such that normal signals on the data line 102 are not undesirably suppressed.

Under normal operating conditions, i.e., without an undesired voltage transient, the first steering diode 104, $D_1$, is in a reverse-biased state or is in an unbiased state. When an undesired positive-going voltage transient is encountered on the data line 102, the positive-going voltage transient forward biases the first steering diode 104, $D_1$. The positive-going voltage transient is thereby clamped to a voltage level that is approximately the sum of the forward voltage drop of the first steering diode 104, $D_1$, (about 1 volt) and the voltage of the voltage reference. In the illustrated embodiment, the voltage reference is the voltage supply 108, $V_{CC}$. Where voltage transient protection with a relatively low clamping voltage and with symmetrical bi-directional operation is desired, the embodiment described later in connection with FIG. 3B can be used.

An anode of the second steering diode 106, $D_2$, is electrically coupled to a ground 110. Under normal operating conditions, the second steering diode 106, $D_2$, is also in a reverse-biased state or in an unbiased state. When an undesired negative-going voltage transient is encountered on the data line 102, the negative-going voltage transient forward biases the second steering diode 106, $D_2$. The negative-going voltage transient is thereby clamped to a voltage level that is below ground potential by the amount of the forward voltage drop of the second steering diode 106, $D_2$.

In another embodiment, the transient voltage protection circuit 100 optionally includes a breakdown diode 112, $D_3$ or transient voltage suppression (TVS) diode. As will be described later in connection with FIGS. 4 and 5, the breakdown diode 112, $D_3$, can be fabricated from epitaxial layers on a monolithic chip that are intended to be used to fabricate a base-emitter junction of a compound semiconductor transistor. In one embodiment, the reverse breakdown voltage of the base-emitter junction used for the breakdown diode 112, $D_3$, is about 7 volts. The breakdown diode 112, $D_3$, can also be fabricated from a base-collector junction of a compound semiconductor transistor. In one embodiment, the reverse breakdown voltage of the base-collector junction used for the breakdown diode 112, $D_3$, is about 11 volts. In the illustrated embodiment, a cathode of the breakdown diode 112, $D_3$, is electrically coupled to the cathode of the first steering diode 104, and to the voltage supply 108, $V_{CC}$. An anode of the breakdown diode 112, $D_3$, is electrically coupled to the anode of the second steering diode 106, $D_2$, and to the ground 110. In some embodiments, multiple sets of steering diodes are electrically coupled to a common breakdown diode as will be described later in connection with FIG. 3A.

Under normal conditions, the breakdown diode 112, $D_3$, is reversed biased below the reverse breakdown voltage of the breakdown diode 112, $D_3$, so that under these normal conditions, there is relatively low conductivity across the breakdown diode 112, $D_3$. When an undesired voltage transient on the voltage supply 108, $V_{CC}$, or some other reference, exceeds the reverse breakdown voltage of the breakdown diode 112, $D_3$, the breakdown diode 112, $D_3$, exhibits relatively high conductivity in the reverse-biased direction. The relatively high conductivity clamps the undesired voltage transient to a safe level. The action of the breakdown diode 112, $D_3$, protects other devices electrically coupled to the voltage supply 108, $V_{CC}$ from undesired transients. In addition, the breakdown diode 112, $D_3$, can also be used by steering diodes to divert undesired voltage transients on the data line 102 when the corresponding chip is in a powered-off state.

Figure 2:
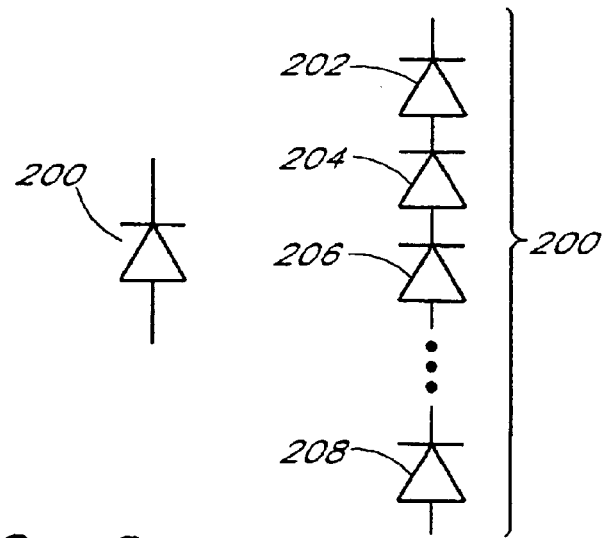
FIG. 2 illustrates a steering diode collection.

FIG. 2 illustrates a steering diode collection 200 with multiple diodes arranged in a stack. As described earlier in connection with FIG. 1, a steering diode can include one or more diodes. The steering diode collection 200 can include a broad range of diodes, from a single diode to multiple diodes as shown in FIG. 2.

In the illustrated steering diode collection 200, N individual diodes are arranged in a series-connected stack. The value of N can vary in a broad range. The steering diode collection 200 includes a first diode 202, a second diode 204, a third diode 206, and an N-th diode 208. The polarities of the first diode 202, the second diode 204, the third diode 206, and the N-th diode 208 are arranged in the same orientation such that forward biasing the steering diode collection 200 forward biases all of the individual diodes within the steering diode collection 200. For example, a cathode of the first diode 202 is the cathode of the steering diode collection 200. An anode of the first diode 202 is electrically coupled to a cathode of the second diode 204. An anode of the second diode 204 is electrically coupled to a cathode of the third diode 206 and so forth.

The series connection of multiple diodes allows the forward drop of the steering diode collection 200 to be selected. Advantageously, the forward voltage drop can be selected such that a protection circuit provides clamping at a low clamping voltage. Where, for example, the steering diode collection 200 includes N diodes arranged in a series-connected stack, the corresponding forward voltage drop of the steering diode collection is the aggregate sum of the N individual forward voltage drops. For example, where there are 3 gallium arsenide (GaAs) diodes arranged in a stack, each with a voltage drop of about 1.1 volts, the corresponding voltage drop of the stack is about 3.3 volts. The series connection of multiple diodes can also result in the reduction of capacitance of the stack of diodes relative to the amount of capacitance of a single diode within the stack. For example, where $C_1$ and $C_2$ express the junction capacitance of a first steering diode and the junction capacitance of a second steering diode, respectively, the capacitance of the series combination of the first steering diode and the second steering diode is approximately CT, as expressed by Equation 1. It will be understood by one of ordinary skill in the art that the actual capacitance of the series combination will vary from Equation 1 due to parasitics and biasing of the diode junctions.

$$\frac{1}{C_T} \approx \frac{1}{C_1} + \frac{1}{C_2} \qquad \text{(Eq. 1)}$$

Figure 3A:
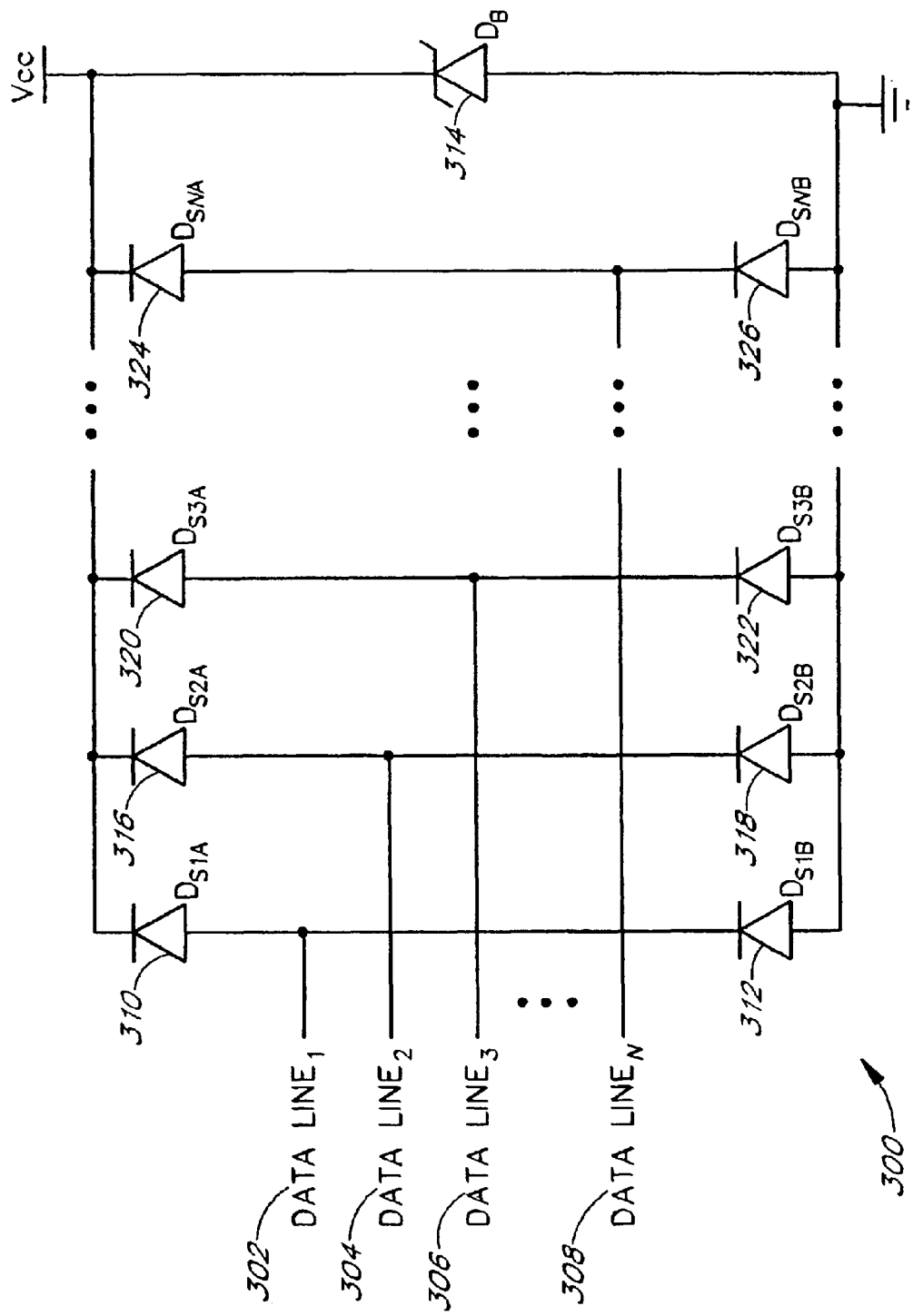
FIG. 3A illustrates one embodiment of a transient voltage protection circuit adapted to protect multiple data lines.

FIG. 3A illustrates one embodiment of a transient voltage protection circuit 300 adapted to protect multiple data lines from undesired voltage transients. Advantageously, the transient voltage protection circuit 300 couples pluralities of steering diodes to a common breakdown diode to reduce the component count for a protection circuit that incorporates the breakdown diode. The breakdown diode can protect devices that are coupled to a power source, such as $V_{CC}$ from undesired transients on $V_{CC}$ and can also protect against voltage transients that occur when a device is disconnected from a power source such as $V_{CC}$. The illustrated transient voltage protection circuit 300 protects N number of data lines. The value for N, the number of data lines protected, can vary in a broad range.

The transient voltage protection circuit 300 shown in FIG. 3A protects a first data line 302, a second data line 304, a third data line 306, and an N-th data line 308 from the undesired transients. The first data line 302 is electrically coupled to an anode of a first steering diode 310, $D_{S1A}$, and to a cathode of a second steering diode 312, $D_{S1B}$. A cathode of the first steering diode 310, $D_{S1A}$, is electrically coupled to a first reference shown here as $V_{CC}$ and to a cathode of a breakdown diode 314, $D_B$. An anode of the second steering diode 312, $D_{S1B}$, is electrically coupled to ground and to an anode of the breakdown diode 314, $D_B$. In response to an undesired positive-going voltage transient on the first data line 302, the first steering diode 310, $D_{S1A}$, couples the transient to $V_{CC}$ and to the cathode of the breakdown diode 314, $D_B$, to protect the first data line 302 and other devices coupled to the first data line 302, from the positive-going voltage transient. In response to a negative-going voltage transient on the first data line 302, the second steering diode 312, $D_{S1B}$, couples the transient to ground and to the anode of the breakdown diode 314, $D_B$, to protect the first data line 302 and other devices coupled to the first data line 302, from the negative-going voltage transient.

A third steering diode 316, $D_{S2A}$, and a fourth steering diode 318, $D_{S2B}$, protect the second data line 304 from undesired transients. The third steering diode 316, $D_{S2A}$, protects the second data line 304 by coupling positive-going transients to $V_{CC}$ and to the breakdown diode 314 $D_B$. The fourth steering diode 318, $D_{S2B}$, protects the second data line 304 from an undesired negative-going transient by coupling the negative-going transient to ground and to the breakdown diode 314, $D_B$. Advantageously, the third steering diode 316, $D_{S2A}$, and the fourth steering diode 318, $D_{S2B}$, couple to the same breakdown diode 314, $D_B$, as the first steering diode 310, $D_{S1A}$, and the second steering diode 312, $D_{S1B}$, to economically share the breakdown diode 314, $D_B$.

Similarly, a fifth steering diode 320, $D_{S3A}$, and a sixth steering diode 322, $D_{S3B}$, couple to the third data line 306 to protect the third data line 306 from undesired transients. The fifth steering diode 320, $D_{S3A}$, and the sixth steering diode 322, $D_{S3B}$, also share the breakdown diode 314, $D_B$. A seventh steering diode 324, $D_{SNA}$, and an eighth steering diode 326, $D_{SNB}$, are coupled to the N-th data line 308 and also share the breakdown diode 314, $D_B$, to protect the N-th data line 308 from undesired transients.

Figure 3B:
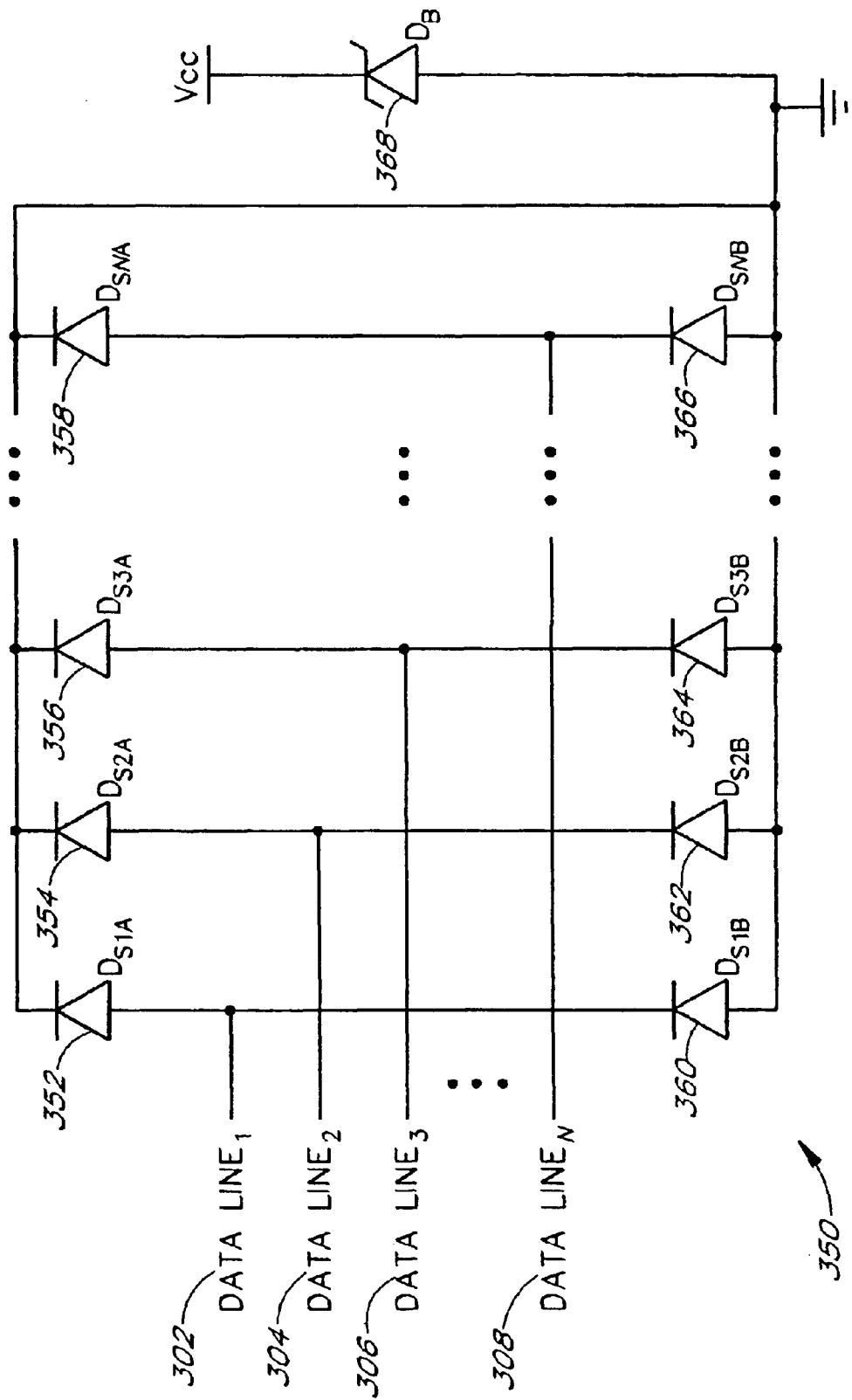
FIG. 3B illustrates another embodiment of a transient voltage protection circuit adapted to protect multiple data lines.

FIG. 3B illustrates another embodiment of a transient voltage protection circuit 350, which is adapted to protect multiple data lines. Devices that are coupled to the first data line 302, the second data line 304, the third data line 306, and the N-th data line 308 are protected by the transient voltage protection circuit 350. Advantageously, the transient voltage protection circuit 350 can be configured to provide symmetrical clamping of undesired voltage transients on the data lines. It will be understood by one of ordinary skill in the art that the number of data lines that can be protected by the transient voltage protection circuit 350 can vary in a very broad range, i.e., the value of N can vary in a broad range.

The first data line 302, the second data line 304, the third data line 306, and the N-th data line 308 are coupled to anodes of a first steering diode 352, $D_{S1A}$, a second steering diode 354, $D_{S2A}$, a third steering diode 356, $D_{S3A}$, and a fourth steering diode 358, $D_{SNA}$, respectively. The cathodes of the first steering diode 352, $D_{S1A}$, the second steering diode 354, $D_{S2A}$, the third steering diode 356, $D_{S3A}$, and the fourth steering diode 358, $D_{SNA}$, are coupled to ground. The first steering diode 352, $D_{S1A}$, the second steering diode 354, $D_{S2A}$, the third steering diode 356, $D_{S3A}$, and the fourth steering diode 358, $D_{SNA}$, thereby clamp undesired positive-going voltage transients on the first data line 302, the second data line 304, the third data line 306, and the N-th data line 308, respectively, to the forward voltage drop (VF) (above ground potential) associated with the steering diodes 352, 354, 356, 358, i.e., to +VF.

The first data line 302, the second data line 304, the third data line 306, and the N-th data line 308 are also coupled to cathodes of a fifth steering diode 360, $D_{S1B}$, a sixth steering diode 362, $D_{S2B}$, a seventh steering diode 364, $D_{S3B}$, and an eighth steering diode 366, $D_{SNB}$, respectively. The anodes of the fifth steering diode 360, $D_{S1B}$, the sixth steering diode 362, $D_{S2B}$, the seventh steering diode 364, $D_{S3B}$, and the eighth steering diode 366, $D_{SNB}$, are coupled to ground. The fifth steering diode 360, $D_{S1B}$, the sixth steering diode 362, $D_{S2B}$, the seventh steering diode 364, $D_{S3B}$, and the eighth steering diode 366, $D_{SNB}$, thereby clamp negative-going voltage transients on the first data line 302, the second data line 304, the third data line 306, and the N-th data line 308, respectively, to the forward voltage drop ($V_F$) (below ground potential) associated with the steering diodes 360, 362, 364, 366, i.e., to $-V_F$.

Advantageously, where the forward drops ($V_F$) of the first steering diode 352, $D_{S1A}$, the second steering diode 354, $D_{S2A}$, the third steering diode 356, $D_{S3A}$, and the fourth steering diode 358, $D_{SNA}$, and the forward drops (VF) of the fifth steering diode 360, $D_{S1B}$, the sixth steering diode 362, $D_{S2B}$, the seventh steering diode 364, $D_{S3B}$, and the eighth steering diode 366, $D_{SNB}$, are the same, the clamping provided by the transient voltage protection circuit 350 is symmetrical with respect to ground. The skilled practitioner will appreciate that the forward drop ($V_F$) of, for example, the first steering diode 352, $D_{S1A}$, and the forward drop ($V_F$) of the fifth steering diode 360, $D_{S1B}$, are the same when the first steering diode 352, $D_{S1A}$, and the fifth steering diode 360, $D_{S1B}$, include the same number of diodes.

The transient voltage protection circuit 350 can further include a breakdown diode 368, $D_B$, which protects a voltage supply or a reference, such as $V_{CC}$, against undesired voltage transients.

Figure 4:
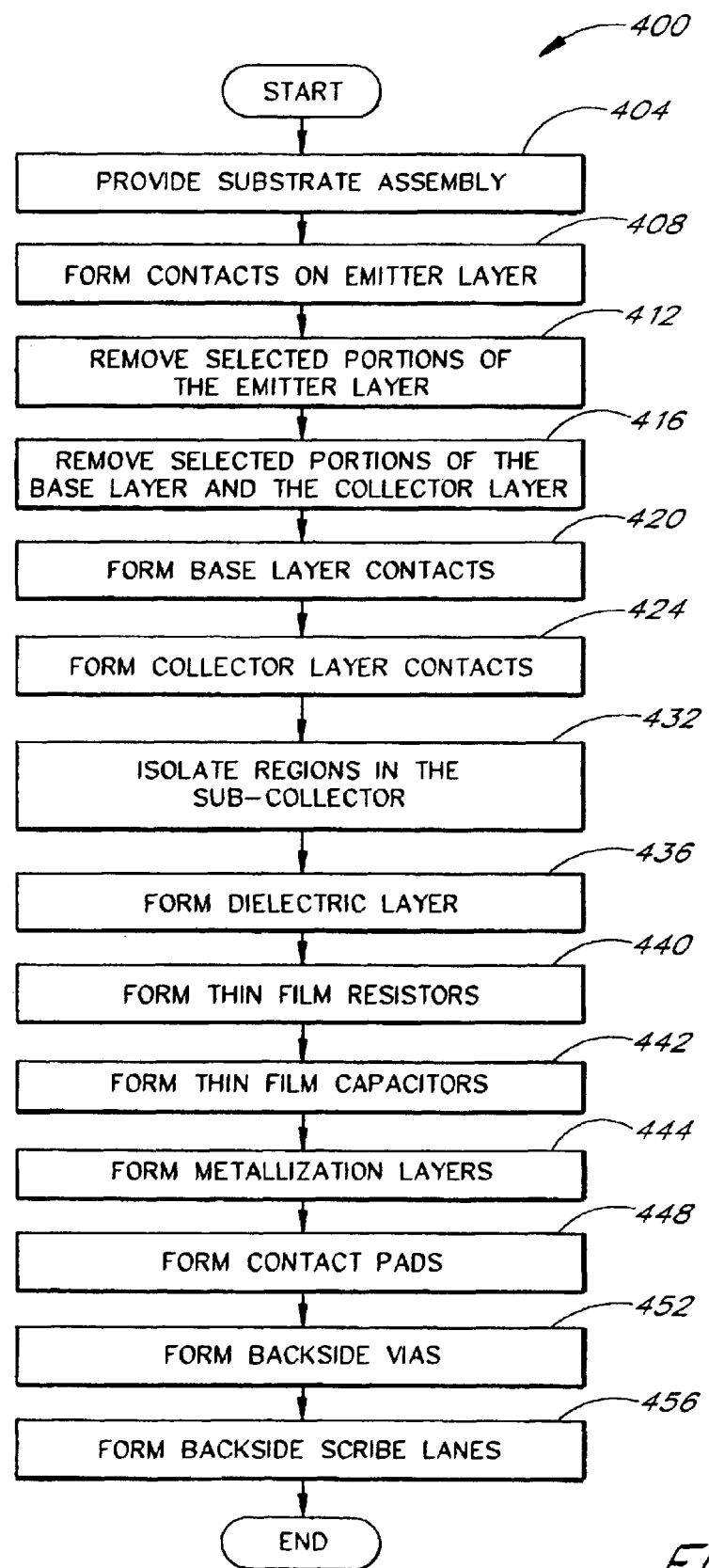
FIG. 4 illustrates a process for fabricating a transient voltage protection circuit.

FIG. 4 illustrates a process 400 for fabricating a transient voltage protection circuit from an epitaxial wafer, such as a Group III–V compound semiconductor monolithic substrate. In a conventional silicon monolithic substrate, a component is laterally formed by forming emitter, base, and collector regions in the substrate by such methods as diffusion and ion implantation. By contrast, an epitaxial wafer, such as a Group III–V compound semiconductor monolithic substrate, has pre-grown epitaxial emitter, base, and collector regions. Portions of the pre-grown emitter, base, and collector regions are selectively removed by etching processes and the like to form devices, such as transistors and diodes. Although the process will be described in the context of fabricating transistors, breakdown diode, and steering diodes, it will be understood that in some embodiments, some devices, such as breakdown diodes, are not fabricated. In addition, it will be understood that the process can be varied in a number of ways, including variations in the sequence or order in which the various steps have been presented.

The process provides 404 a substrate assembly from which the transient voltage protection circuit is to be fabricated. The substrate assembly can be part of a relatively large wafer and can include pluralities of transient voltage protection circuits, which are fabricated at the same time. In one embodiment, the substrate assembly includes, from bottom to top, a semi-insulating substrate layer, a sub-collector layer, a collector layer, a base layer, and an emitter layer. For example, in one embodiment, the substrate assembly includes a semi-insulating substrate, an N+ sub-collector layer, an N-type collector layer, a P-type base layer, and an N-type emitter layer. In another embodiment, the substrate assembly corresponds to a semi-insulating substrate, a P+ sub-collector layer, a P-type collector layer, an N-type base layer, and a P-type emitter layer.

The process proceeds to form emitter layer 408 on the substrate assembly. The contacts provide low resistance to and adhesion between the various emitter portions of the substrate assembly and metallization, which is deposited later. In addition, the contact can provide a barrier against the undesired diffusion of atoms from the metallization to the substrate.

The process proceeds to remove 412 selected undesired portions of the emitter layer. Portions of the emitter layer are removed to electrically isolate devices from each other and to provide access to other layers for further removal or to make electrical contact. A variety of standard processes can be used to remove the undesired portions. These processes can include photoresist processes, dry or wet etching processes, and the like. The portions of the emitter layer removed include portions surrounding transistors, breakdown diodes, and steering diodes that are to be made. The portions of the emitter layer removed can also include portions above the base layer for transistors, breakdown diodes, and steering diodes.

A portion of the emitter layer is removed above transistors and breakdown diodes that are to be formed. This allows a contact or metallization to be formed on the base layer of the transistor or the breakdown diode to provide electrical coupling to the base of the transistor or to the anode of the breakdown diode. It will be understood by one of ordinary skill in the art that the entire area of the emitter layer above the base layer of the transistor or breakdown diode is not removed because a portion of the emitter layer remains to form an emitter for the transistor or a cathode for the breakdown diode.

The portions removed also include the area above an anode of a steering diode so that a contact can be deposited on the corresponding portion of the base layer to provide electrical continuity to the anode of the steering diode. In one embodiment, all of the area above the anode of a steering diode is removed. However, the skilled practitioner will appreciate that an electrical contact with the anode can also be made with the removal of only a portion of the emitter layer area above the anode of the steering diode.

The process proceeds to remove 416 selected undesired portions of the base layer and selected undesired portions of the collector layer. Portions of the base layer are removed to electrically isolate devices from each other and to provide access to other layers for further removal or to make electrical contact with a portion of a layer further below the base layer. The portions of the base layer removed include portions surrounding transistors, breakdown diodes, and steering diodes that are to be made.

Portions of the collector layer are removed to electrically isolate devices from each other and to provide access to other layers for further removal or to make electrical contact with a layer further below the collector layer. The portions of the collector layer removed include portions surrounding transistors, breakdown diodes, and steering diodes that are to be made. It will be understood by one of ordinary skill in the art that the portions of the collector layer removed include portions around the collector layer of a breakdown diode, even though the collector layer of the breakdown diode is not used by the breakdown diode as either an anode or as a cathode. In one embodiment, the process removes 416 selected undesired portions of the base layer and selected undesired portions of the collector layer with two etching steps. In a first step, the process removes selected relatively thin portions of the emitter layer that had been removed 412 incompletely and remain on top of portions of the base layer. In a second step, the process removes selected portions of the base layer and the collector layer to form mesa-like structures for the diodes and transistors as described later in connection with FIG. 5. In one embodiment, the first step and the second step use etching techniques to remove the material from the appropriate layers.

The process proceeds to form base layer contacts 420 on the substrate assembly. The contacts provide low resistance to and adhesion between the various base portions of the substrate assembly and metallization, and also provide barrier against the undesired diffusion of atoms from the metallization to the applicable portion of the substrate assembly.

The process proceeds to form collector layer contacts 424 on the substrate assembly. The contacts provide low resistance to and adhesion between the various collector portions of the substrate assembly and metallization, and provides a barrier against the undesired diffusion of atoms from the metallization to applicable portion of the substrate assembly.

The process proceeds to isolate 432 regions in the sub-collector layer. In one embodiment, ion-implantation techniques are used to create isolation regions in the sub-collector layer. In another embodiment, etching techniques are used to remove and thereby isolate regions in the sub-collector layer. Examples of dopants that can be implanted to form isolation regions include helium, beryllium, hydrogen, boron, and others. Regions of the sub-collector that are not ion implanted exhibit relatively high conductivity and can be used as an electrical conductor coupled to the collector layer of a corresponding transistor or a corresponding steering diode. The collector layer of the transistor or the steering diode is used to fabricate a collector for the transistor or a cathode for the breakdown diode. The ion-implanted regions in the sub-collector layer exhibit a relatively large amount of resistance, thereby separating the sub-collector layer into islands of relatively high conductivity underneath a collector of a transistor or a cathode of a breakdown diode. In one embodiment, the relatively high conductivity of the sub-collector layer is used to electrically couple the collector of a corresponding transistor or the cathode of a corresponding steering diode to an interconnect such as a contact or a metallization layer.

The process proceeds to form 436 insulating or dielectric regions for protective layers and for electrical insulation. In one embodiment, the process deposits a film of silicon nitride (SiN) using a standard process such as a low pressure chemical vapor deposition (LPCVD) process, and undesired portions of the film are removed by standard processing techniques such as photoresist and etching processes. It will be understood by one of ordinary skill in the art that other materials, such as silicon oxide ($SiO_2$) can be substituted for silicon nitride (SiN), but that silicon nitride (SiN) provides a superior protective layer. The insulating regions prevent undesired electrical coupling with contacts and metallization. The insulating regions also protect the underlying substrate materials against the diffusion of impurities and moisture. In addition, openings can be formed in the dielectric layer to provide access to devices below the protective layer. It will be understood by one of ordinary skill in the art that the application of a dielectric layer can be repeated many times, particular where the interconnects between devices use multi-layer metallization.

The process proceeds to form thin film resistors 440, as applicable, on the substrate assembly. Although the transient voltage protection circuits described herein do not need thin film resistors, it will be understood by one of ordinary skill in the art that other circuits, including those that are protected by transient voltage protection circuits, can be fabricated at the same time on the same wafer, and that these other circuits may include such thin film resistors. The thin film resistors can be formed from, for example, nickel chromium (NiCr).

The process proceeds to form thin film capacitors 442, as applicable, on the substrate assembly. Although the transient voltage protection circuits described herein do not need thin film capacitors, the skilled practitioner will appreciate that other circuits, including circuits that are protected by transient voltage protection circuits, can be fabricated at the same time on the same wafer, and that these other circuits may include such thin film capacitors. The thin film capacitors can be formed from a variety of materials, such as from silicon nitride (SiN) dielectric materials, and electrodes.

The process proceeds to form metallization layers 444. The metallization layers are used to build interconnects between devices, such as between a steering diode and a transistor. Advantageously, such interconnects do not utilize mechanical bond wire connections and the like, which are both expensive and unreliable. A variety of metals and alloys can be used for the metallization. In one embodiment, the metallization is formed from an alloy of titanium platinum gold (TiPtAu). A variety of processes can be used to deposit the metallization. These processes include physical vapor deposition (PVD) techniques such as evaporation, and can include chemical vapor deposition (CVD) techniques. Undesired portions of the metallization can be removed by, for example, a lift off processes. The deposition of metallization layers and the deposition of dielectric layers can be repeated as necessary to form the interconnects. Where a barrier is not required, polyimide can be deposited as the insulating or dielectric layer for use as the interlayer dielectric.

The process proceeds to form contact pads 448 on the substrate assembly. The contact pads are used to attach to other circuits or to the appropriate pins of the IC package through bond wires and the like.

The process proceeds to form backside vias 452. An example of a backside via is described later in connection with FIG. 5. The backside via is an alternative way to electrically access a contact for a collector and can provide a better connection to ground through the bottom of the corresponding die. The process patterns a trench from the backside of the substrate assembly to a contact on the topside of the substrate assembly. In one embodiment, the process evaporates a metal, such as titanium tungsten/gold (TiW/Au), and electroplates gold (Au) to form a sheet.

The process proceeds to form backside scribe lanes 456 by removing, via etching techniques and the like, undesired areas of the gold (Au) that was deposited on the backside. The gold (Au) that remains acts as a conductor for the backside via.

As will be appreciated by the skilled practitioner, the process can further include steps such as die separation and wire bonding of the metallization to the appropriate pins of the IC package.

Figure 5:
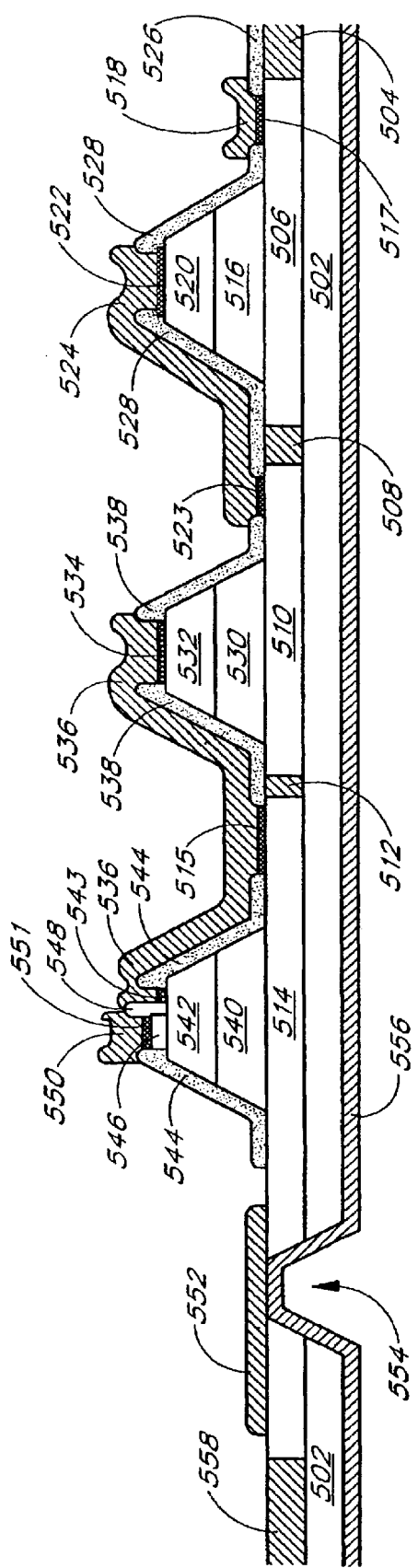
FIG. 5 is a cross-sectional view of an exemplary layout of a transient voltage protection circuit.

FIG. 5 is a cross-sectional view of an exemplary layout of a transient voltage protection circuit. The transient voltage protection circuit is fabricated from a monolithic substrate of a Group III–V compound semiconductor such as gallium arsenide (GaAs), indium phosphide (InP), and the like. The monolithic substrate includes pre-grown layers, which are processed as described earlier in connection with FIG. 4 to produce the transient voltage protection circuit.

While illustrated in the context of a semi-insulating substrate, an N+ sub-collector layer, an N-type collector layer, a P-type base layer, and an N-type emitter layer, it will be understood by one of ordinary skill in the art that the principles and advantages described in connection with FIG. 5 are applicable to a semi-insulating substrate, a P+ sub-collector layer, a P-type collector layer, an N-type base layer, and a P-type emitter layer.

One embodiment of the transient voltage protection circuit includes a semi-insulating substrate 502, such as a substrate of gallium arsenide (GaAs). Advantageously, a gallium arsenide (GaAs) substrate has a much higher resistivity than a silicon (Si) substrate, which allows devices to be more easily isolated and reduces leakage currents thereby enhancing battery life in portable electronics. In one embodiment, the leakage current from a protected data line to a reference is less than 1 microamp ($\mu$A).

Above the semi-insulating substrate 502 is an N+ sub-collector layer, from which islands of relatively conductive materials and isolation regions are formed. As illustrated in FIG. 5, a first isolation region 504, a first N+ sub-collector island 506, a second isolation region 508, a second N+ sub-collector island 510, a third isolation region 512, and a third N+ sub-collector island 514 are formed in the N+ sub-collector layer. It will be understood by one of ordinary skill in the art that the isolation regions, as shown by the first isolation region 504, the second isolation region 508, and the third isolation region 512, may form ring-like structures which surround the sub-collector islands of the respective devices and, in fact, may be part of the same isolation region such that, for example, the first isolation region 504 and the second isolation region 508 are part of the same isolation region. The isolation regions allow electrical isolation of islands within the N+ sub-collector layer such as electrical isolation of the first N+ sub-collector island 506 from the second N+ sub-collector island 510. The isolation region can be formed by a variety of techniques, such as by ion implantation and by etching.

Above the first N+ sub-collector island 506 is a cathode 516 of a first steering diode. By way of example, the first steering diode illustrated in FIG. 5 can correspond to the first steering diode 104, $D_1$, described earlier in connection with FIG. 1. The cathode 516 is formed from the collector layer, which is also used to form collectors for transistors. In the illustrated cross section, the cathode 516 is electrically coupled to a first electrode 518 through the first N+ sub-collector island 506 and a contact 517. The contact 517 is formed under the first electrode 518 to provide low resistance to and greater adhesion to the first N+ sub-collector island 506 and/or to provide a barrier against the undesired diffusion of atoms from the first electrode 518 to the first N+ sub-collector island 506. The first electrode 518 can be electrically coupled to a first reference, such as the voltage supply 108, $V_{CC}$, described earlier in connection with FIG. 1.

Above the cathode 516 is an anode 520 of the first steering diode. The anode 520 is formed from a base layer that is also used to form bases for transistors. In the illustrated embodiment, the emitter layer above the anode 520 has been etched away and a first contact 522 is deposited on the anode 520 to provide electrical coupling to a second electrode 524.

A dielectric such as silicon nitride (SiN) is deposited to form a first insulator 526 and a second insulator 528. The first insulator 526 prevents the first electrode 518 from undesirably electrically coupling to an adjacent device. The second insulator 528 is deposited around the cathode 516 and the anode 520 of the first steering diode and similarly prevents the undesired electrical coupling of the first electrode 518 and/or the second electrode 524 to portions of the first N+ sub-collector island 506, the cathode 516, and the anode 520.

The second electrode 524 electrically couples the anode 520 of the first steering diode to the second N+ sub-collector island 510 through a fourth contact 523. The fourth contact 523 provides low resistance to and adhesion to the second N+ sub-collector island 510 and provides a barrier against the diffusion of atoms from the second electrode 524 to the substrate assembly. The second N+ sub-collector island 510 is coupled to a cathode 530 of a second steering diode, which can correspond to the second steering diode 106 described earlier in connection with FIG. 1. Advantageously, the second electrode 524 thereby couples the anode 520 of the first steering diode to the cathode 530 of the second steering diode without the need for relatively fragile, expensive, and highly inductive bond wires. In one embodiment, the first and the second steering diodes are located adjacent to the devices which are to be protected by the transient voltage protection circuit so that the second, electrode 524 electrically couples to the protected line, such as the data line 102 described earlier in connection with FIG. 1. Of course, when the corresponding integrated circuit is assembled in a package, a bond wire can be used to attach the second electrode 524 to an external signal via a package pin.

The cathode 530 of the second steering diode is formed from the collector layer, which is also used to form collectors of transistors. Above the cathode 530 of the second steering diode is an anode 532 of the second steering diode. The anode 532 is formed from the base layer, which is also used to form bases of transistors. The emitter layer above the anode 532 is either partially or wholly etched away, and a second contact 534 is formed on top of the anode 532. The second contact 534 can be used to provide low resistance to and adhesion between a third electrode 536 and the anode 532 and/or can be used as a barrier to prevent the undesired diffusion of atoms from the third electrode 536 to the anode 532.

A third insulator 538 is deposited around the cathode 530 and the anode 532 of the second steering diode. The third insulator 538 prevents the undesired electrical coupling of the cathode 530 and the anode 532 to conductors such as the second electrode 524 and the third electrode 536. In addition, the third insulator 538 can protect the cathode 530 and the anode 532 from the undesired diffusion of impurities and moisture.

A breakdown diode is formed above the third N+ sub-collector island 514. In the illustrated embodiment, the breakdown diode is formed from a base-emitter junction of a transistor, and the collector of the transistor is electrically shorted to the base. The breakdown diode can correspond to the breakdown diode 112 described earlier in connection with FIG. 1. Above the third N+ sub-collector island 514 is a collector 540. The collector 540 is formed from the collector layer. The collector 540 is unused where the transistor is configured as the breakdown diode, and the collector 540 is electrically shorted by the third electrode 536 to an anode 542 of the breakdown diode. The third electrode 536 couples to the collector 540 through the third N+ sub-collector island 514 and a third contact 515. The third electrode 536 couples to the anode 542 of the breakdown diode through a fifth contact 543. In one embodiment, the third electrode 536 is further coupled to a reference, such as to the ground 110 described earlier in connection with FIG. 1. In one embodiment, the ground 110 is provided through a seventh contact 552 and a backside via 554.

The anode 542 is formed from the base layer, which is also used to fabricate bases of transistors. It will be understood by one of ordinary skill in the art that a contact of a barrier metal can also be formed between the collector 540 and the third electrode 536 and/or between the anode 542 and the third electrode 536. A fourth insulator 544 prevents the undesired diffusion of atoms from the third electrode 536 to the collector 540 and the anode 542, and also protects the collector 540, the anode 542, and a cathode 546 of the breakdown diode from the undesired diffusion of impurities and moisture.

The cathode 546 is formed from the emitter layer above the anode 542. The emitter layer can also be used to form emitters of transistors. A portion of the cathode 546 is removed from the surface of the anode 542 such that a contact and/or the third electrode 536 can form on the anode 542 to provide electrical coupling to the anode 542. A fifth insulator 548 provides electrical isolation between the third electrode 536 and a fourth electrode 550, which is coupled to the anode 542 through a sixth contact 551. One embodiment further includes a contact between the fourth electrode 550 and the cathode 546 to prevent the undesired diffusion of atoms from the fourth electrode 550 to the cathode 546. In one embodiment, a bond wire electrically couples the fourth electrode 550 and hence, the cathode 546 the breakdown diode to a reference such as the voltage supply 108, $V_{CC}$, described earlier in connection with FIG. 1.

In one embodiment, a ground connection is provided through the backside of the substrate assembly. A layer of gold (Au) 556 can provide a ground connection to the backside via 554. In one embodiment, the layer of gold (Au) 556 is formed by electroplating gold over an evaporated metal or alloy, such as a layer of titanium tungsten/gold (TiW/Au). The backside via 554 allows the ground reference to cross over from the backside of the substrate assembly to the topside and to connect to the transient voltage protection circuit. For example, the backside via 554 couples the ground reference to the seventh contact 552, which in turn couples the ground to the third N+ sub-collector island 514, which conducts the group to the third electrode 536 through the third contact 515. Where isolation is needed, a fourth isolation region 558 provides electrical isolation between the ground provided through the seventh contact 552 and an adjacent circuit.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A transient voltage protection integrated circuit comprising:

a first steering diode comprising a first transistor with an emitter layer removed, wherein a base layer of the first transistor is an anode of the first steering diode and a collector layer of the first transistor is a cathode of the first steering diode; and a second steering diode comprising a second transistor with an emitter layer removed, wherein a base layer of the second transistor is an anode of the second steering diode and a collector layer of the second transistor is a cathode of the second steering diode, and wherein the anode of the first steering diode and the cathode of the second steering diode are commonly connected and electrically coupled to a data line.

2. The transient voltage protection integrated circuit of claim 1, wherein the transient voltage protection integrated circuit is fabricated from an epitaxial wafer.

3. The transient voltage protection integrated circuit of claim 2, wherein the epitaxial wafer is a Group III–V compound semiconductor.

4. The transient voltage protection integrated circuit of claim 2, wherein the epitaxial wafer is a Group IV compound semiconductor.

5. The transient voltage protection integrated circuit of claim 1, wherein the first steering diode and the second steering diode are monolithically integrated with the data processing circuit.

6. The transient voltage protection integrated circuit of claim 1, wherein the first steering diode and the second steering diode are fabricated and packaged as a separate integrated circuit from the data processing circuit and are coupled together via a printed wiring board with the transient voltage protection integrated circuit placed in front of the data processing circuit in a data path.

7. The transient voltage protection integrated circuit of claim 1, further comprising a breakdown diode comprising a third transistor, wherein a base layer of the third transistor is electrically shorted to a collector layer of the third transistor to correspond to an anode of the breakdown diode and an emitter layer of the third transistor corresponds to a cathode of the breakdown diode, and wherein the cathode of the breakdown diode is electrically coupled to the cathode of first steering diode and the anode of the breakdown diode is electrically coupled to the anode of second steering diode.

8. An integrated protection circuit comprising:
   a first plurality of steering diodes connected in series; and
   a second plurality of steering diode connected in series, wherein the steering diodes comprise a plurality of transistors without emitter layers, wherein base layers correspond to anodes of the respective steering diode and collector layers correspond to cathodes of the respective steering diode.

9. A monolithically integrated protection device comprising:
   a plurality of first steering diodes, wherein cathodes of the respective first steering diodes are commonly connected to a first reference;
   a plurality of second steering diodes, wherein anodes of the respective second steering diodes are commonly connected to a second reference, wherein cathodes of the second steering diodes and anodes of the first steering diodes are commonly connected to a plurality of respective signal lines, and wherein the first steering diodes and the second steering diodes comprise a plurality of base-collector junctions of respective transistors without emitters; and
   a breakdown diode on a common side of a wafer as the steering diodes, wherein the breakdown diode is comprises a transistor with an emitter configured as a cathode of the breakdown diode and with a base configured as an anode of the breakdown diode, and wherein a collector of the transistor is shorted to the base.

10. The monolithically integrated protection device of claim 9, wherein the first reference, the second reference, and the anode of the breakdown diode are commonly and electrically coupled to ground while the cathode of the breakdown diode is electrically coupled to a supply voltage.

* * * * *

UNITED STATES PATENT AND TRADEMARK OFFICE
CERTIFICATE OF CORRECTION

PATENT NO. : 6,838,710 B1
DATED : January 4, 2005
INVENTOR(S) : Vrej Barkhordarian It is certified that error appears in the above-identified patent and that said Letters Patent is hereby corrected as shown below:

Column 18,
Line 16, delete "is".

Signed and Sealed this

Twenty-second Day of November, 2005

JON W. DUDAS
*Director of the United States Patent and Trademark Office*